(12) United States Patent
Tsai et al.

(10) Patent No.: US 12,302,523 B2
(45) Date of Patent: May 13, 2025

(54) ELECTRICAL DEVICE

(71) Applicant: DELTA ELECTRONICS, INC., Taoyuan (TW)

(72) Inventors: Jen-Chieh Tsai, Taoyuan (TW); Chen-Wei Liu, Taoyuan (TW); Cheng-Wei Chiu, Taoyuan (TW); Yi-Chih Hsu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 94 days.

(21) Appl. No.: 18/048,432

(22) Filed: Oct. 20, 2022

(65) Prior Publication Data

US 2023/0345645 A1    Oct. 26, 2023

(30) Foreign Application Priority Data

Apr. 22, 2022   (CN) .......................... 202210428045.3

(51) Int. Cl.
*H05K 5/15* (2025.01)
*H05K 5/00* (2006.01)
*H05K 5/13* (2025.01)
*H05K 7/14* (2006.01)

(52) U.S. Cl.
CPC ............. *H05K 5/15* (2025.01); *H05K 5/0047* (2013.01); *H05K 5/13* (2025.01); *H05K 7/14322* (2022.08)

(58) Field of Classification Search
CPC ...... H05K 5/0004; H05K 5/03; H05K 5/0247; H05K 5/0013; H05K 5/0008; H05K 5/0047; H05K 5/0069; H05K 7/1427; H05K 7/1432; H05K 7/14325; H05K 7/1434; H05K 7/14322; H01R 13/502; H01R 13/5213; H01R 13/5816; H01R 13/582; H02M 7/00
See application file for complete search history.

(56) References Cited

U.S. PATENT DOCUMENTS

| 5,148,618 A | 9/1992 | Brewster |
| 5,588,271 A | 12/1996 | Pitchford |
| 5,601,470 A | 2/1997 | Yao |
| 5,740,620 A | 4/1998 | Giese et al. |

(Continued)

FOREIGN PATENT DOCUMENTS

| CN | 103533786 A | 1/2014 |
| CN | 109890163 A | 6/2019 |

(Continued)

*Primary Examiner* — Timothy J Thompson
*Assistant Examiner* — Paramita Ghosh
(74) *Attorney, Agent, or Firm* — CKC & Partners Co., LLC

(57) ABSTRACT

An electrical device includes a container, a conversion unit, an outer cover and an inner cover. The container is provided with an inner bottom surface and an inner which define an accommodating channel together. An inlet of the accommodating channel is opposite to the inner bottom surface. The conversion unit is disposed within the accommodating channel. The outer cover covers the inlet of the accommodating channel. The inner cover is disposed within the accommodating channel, and located between the conversion unit and the outer cover. One part of the conversion unit extends to the opening, and at least one outer edge of the inner cover is connected to an inner wall of the container.

19 Claims, 11 Drawing Sheets

(56) References Cited

U.S. PATENT DOCUMENTS

| | | | | |
|---|---|---|---|---|
| 6,094,349 | A * | 7/2000 | Fassel | H05K 7/20454 |
| | | | | 361/728 |
| 6,688,487 | B2 | 2/2004 | Oakes | |
| 6,717,126 | B1 | 4/2004 | Glenn et al. | |
| 7,416,166 | B1 | 8/2008 | Shaw | |
| 9,560,783 | B2 | 1/2017 | Kang et al. | |
| 2006/0036362 | A1 * | 2/2006 | Ikeda | H05K 7/026 |
| | | | | 701/105 |
| 2007/0154265 | A1 | 7/2007 | Stauffacher | |
| 2012/0169257 | A1 * | 7/2012 | Brereton | H05K 7/209 |
| | | | | 318/139 |
| 2014/0345492 | A1 * | 11/2014 | Fujito | B60L 15/007 |
| | | | | 105/61 |
| 2015/0253520 | A1 * | 9/2015 | Huang | G02B 6/4206 |
| | | | | 385/93 |
| 2017/0127540 | A1 * | 5/2017 | You | H05K 9/0007 |
| 2018/0206349 | A1 | 7/2018 | I et al. | |
| 2019/0174641 | A1 * | 6/2019 | Kato | H01R 4/34 |
| 2019/0304511 | A1 * | 10/2019 | Hisakuni | H05K 5/0247 |
| 2019/0341080 | A1 * | 11/2019 | Woldemar | G11B 33/02 |

FOREIGN PATENT DOCUMENTS

| | | |
|---|---|---|
| CN | 210381632 U | 4/2020 |
| CN | 111132488 A | 5/2020 |
| CN | 111917283 A | 11/2020 |
| CN | 212032564 U | 11/2020 |
| CN | 212183923 U | 12/2020 |
| CN | 212765766 U | 3/2021 |
| CN | 213152020 U | 5/2021 |
| JP | 2022-48967 A | 3/2022 |
| TW | M322016 U | 11/2007 |
| TW | M392768 U1 | 11/2010 |
| TW | 201904370 A | 1/2019 |
| TW | I738469 B | 9/2021 |
| WO | 2020/217912 A1 | 10/2020 |

\* cited by examiner

ELECTRICAL DEVICE

RELATED APPLICATIONS

This application claims priority to China Application Serial Number 202210428045.3, filed on Apr. 22, 2022, which is herein incorporated by reference.

BACKGROUND

Field of Disclosure

The present disclosure relates to an electrical device. More particularly, the present disclosure relates to an electrical device having both an inner cover and an outer cover.

Description of Related Art

In general, an electronic product includes electronic circuits and a housing. The housing is used to receive the electronic circuits for shielding the electronic circuit.

However, if the structural strength of the housing of the above-mentioned electronic product is not good, it will inevitably lead to problems of safety concerns and insufficient consumer confidence.

Therefore, the above-mentioned technologies obviously still have inconveniences and defects, which are problems to be solved urgently in the industry.

SUMMARY

One aspect of the present disclosure is to provide an electrical device for solving the difficulties mentioned above in the prior art.

In one embodiment of the present disclosure, an electrical device is provided, and the electrical device includes a container, a conversion unit, an outer cover and an inner cover. The container includes an inner bottom surface and at least one inner wall. The inner bottom surface and the inner wall collectively define an accommodating channel, and an inlet of the accommodating channel is opposite to the inner bottom surface. The conversion unit is disposed within the accommodating channel. The outer cover covers the inlet of the accommodating channel. The inner cover is disposed within the accommodating channel, and located between the conversion unit and the outer cover. The inner cover includes a cover body and an opening is formed on the cover body. One part of the conversion unit extends to the opening, and at least one outer edge of the cover body is connected to the inner wall of the container.

According to one or more embodiments of the present disclosure, in the electrical device, the container includes at least one first flange and at least one second flange. The first flange is disposed on the inner wall of the container for supporting the outer cover. The second flange is disposed on the inner wall of the container, and arranged between the first flange and the inner bottom surface for supporting the inner cover.

According to one or more embodiments of the present disclosure, in the electrical device, the inner cover is fixed on the first flange through a first bonding layer, and the outer cover is fixed on the second flange through a second bonding layer.

According to one or more embodiments of the present disclosure, in the electrical device, a gap is formed between the outer cover and the inner cover, and the opening is in communication with the gap and the accommodating channel. The part of the conversion unit extends into the gap through the opening.

According to one or more embodiments of the present disclosure, the electrical device includes a connection unit. The inner cover is formed with a first through hole, the outer cover is formed with a second through hole, and the second through hole is corresponded to the first through hole and in communication with the accommodating channel through the first through hole, and the connection unit passes through the first through hole and the second through hole.

According to one or more embodiments of the present disclosure, in the electrical device, one part of the outer cover is connected to the part of the conversion unit which extends into the opening.

According to one or more embodiments of the present disclosure, in the electrical device, the conversion unit includes a circuit board fixed to the cover body and the inner wall, and one part of the circuit board is the part of the conversion unit.

According to one or more embodiments of the present disclosure, in the electrical device, the inner cover includes a mesh area formed on the cover body.

According to one or more embodiments of the present disclosure, in the electrical device, a ratio of a coverage area of the inner cover to a cross-sectional area of the accommodating channel is in a range of 70% to 95%.

In one embodiment of the present disclosure, an electrical device is provided, and the electrical device includes a container, a conversion unit, an outer cover and an inner cover. The container includes an inner bottom surface and at least one inner wall. The inner bottom surface and the inner wall collectively define an accommodating channel, and an inlet of the accommodating channel is opposite to the inner bottom surface. The conversion unit includes a high-voltage-side voltage unit disposed within the accommodating channel. The outer cover covers the inlet of the accommodating channel. The inner cover is disposed within the accommodating channel, and located between the conversion unit and the outer cover. The inner cover includes a cover body covering the high-voltage-side voltage unit, and an opening is formed on the cover body. One part of the conversion unit extends to the opening, and at least one outer edge of the cover body is connected to the inner wall.

According to one or more embodiments of the present disclosure, in the electrical device, the container includes at least one first flange and at least one second flange. The first flange is disposed on the inner wall of the container for supporting the outer cover. The second flange is disposed on the inner wall of the container, and arranged between the first flange and the inner bottom surface for supporting the inner cover.

According to one or more embodiments of the present disclosure, in the electrical device, a gap is formed between the outer cover and the inner cover. The inner cover further includes a convex portion and a groove. The convex portion extends into the gap from one surface of the cover body, the groove corresponds to the convex portion, and the groove is recessed in a direction from the other surface of the cover body towards the convex portion. One part of the conversion unit is located within the groove.

According to one or more embodiments of the present disclosure, the electrical device further includes a connection unit. The inner cover is formed with a first through hole. The outer cover is formed with a second through hole, and the second through hole is corresponded to the first through hole and in communication with the accommodating channel through the first through hole. The connection unit passes through the first through hole and the second through hole.

According to one or more embodiments of the present disclosure, in the electrical device, a ratio of a coverage area of the inner cover to a cross-sectional area of the accommodating channel is in a range of 70% to 95%.

According to one or more embodiments of the present disclosure, in the electrical device, the inner cover includes a mesh area formed on the cover body and overlapped with the high-voltage-side voltage unit.

In one embodiment of the present disclosure, an electrical device is provided, and the electrical device includes a container, a conversion unit, an outer cover and an inner cover. The container includes an inner bottom surface and at least one inner wall. The inner bottom surface and the inner wall collectively define an accommodating channel, and an inlet of the accommodating channel is opposite to the inner bottom surface. The conversion unit is disposed within the accommodating channel. The outer cover covers the inlet of the accommodating channel. The inner cover is disposed within the accommodating channel, and located between the conversion unit and the outer cover. The inner cover includes a cover body totally covering the conversion unit. At least one outer edge of the cover body is connected to the inner wall.

According to one or more embodiments of the present disclosure, in the electrical device, the container includes at least one first flange and at least one second flange. The first flange is disposed on the inner wall of the container for supporting the outer cover. The second flange is disposed on the inner wall of the container, and arranged between the first flange and the inner bottom surface for supporting the inner cover.

According to one or more embodiments of the present disclosure, in the electrical device, the inner cover is fixed on the first flange through a first bonding layer, and the outer cover is fixed on the second flange through a second bonding layer.

According to one or more embodiments of the present disclosure, in the electrical device, a gap is formed between the outer cover and the inner cover, and the inner cover further includes a convex portion and a groove. The convex portion extends into the gap from one surface of the cover body, the groove corresponds to the convex portion, and the groove is recessed in a direction from the other surface of the cover body towards the convex portion. One part of the conversion unit is located within the groove.

According to one or more embodiments of the present disclosure, in the electrical device, the cover body includes a mesh area overlapped with the conversion unit.

Thus, through the construction of the embodiments above, not only the structural strength of the electrical device can be improved, but also the safety concerns caused by the external exposure of the internal electrical components can be reduced.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
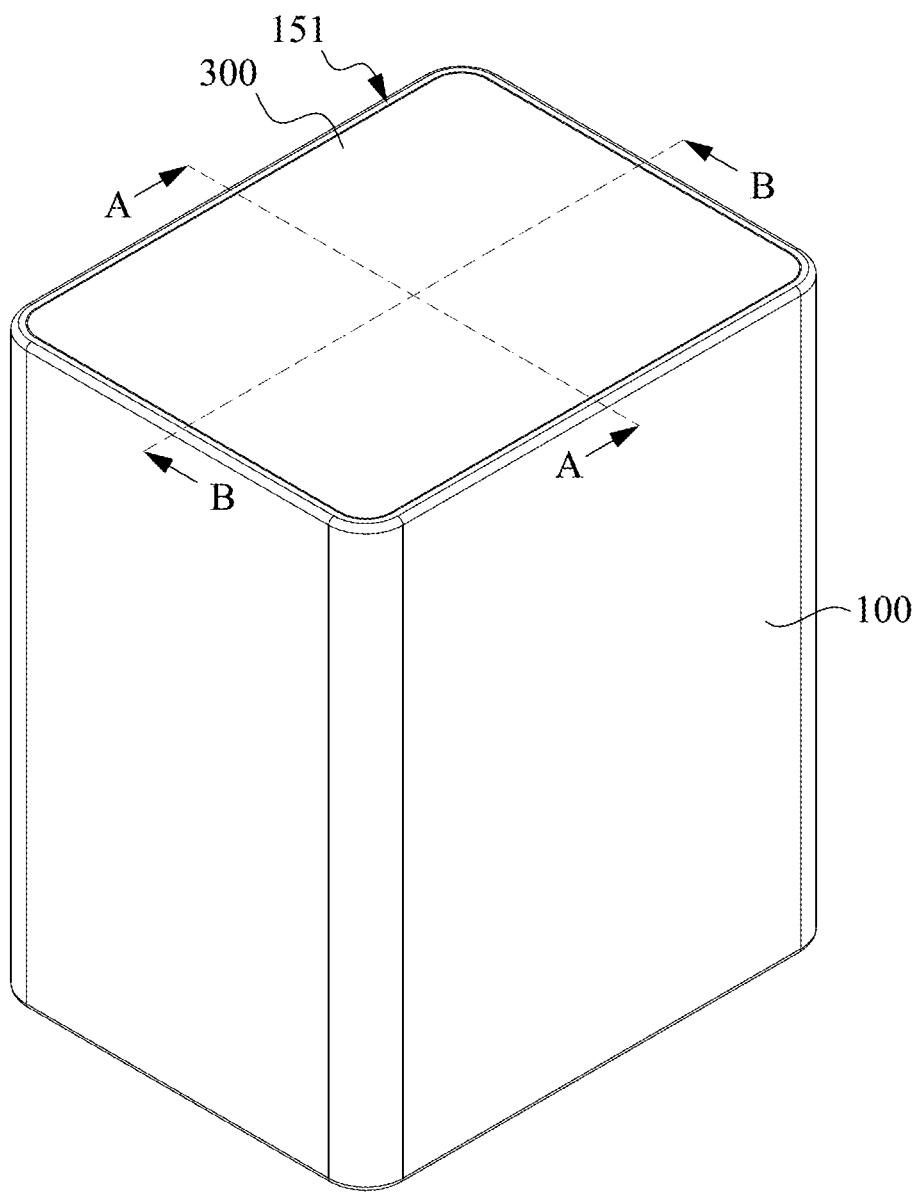
FIG. 1 is a perspective view of an electrical device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
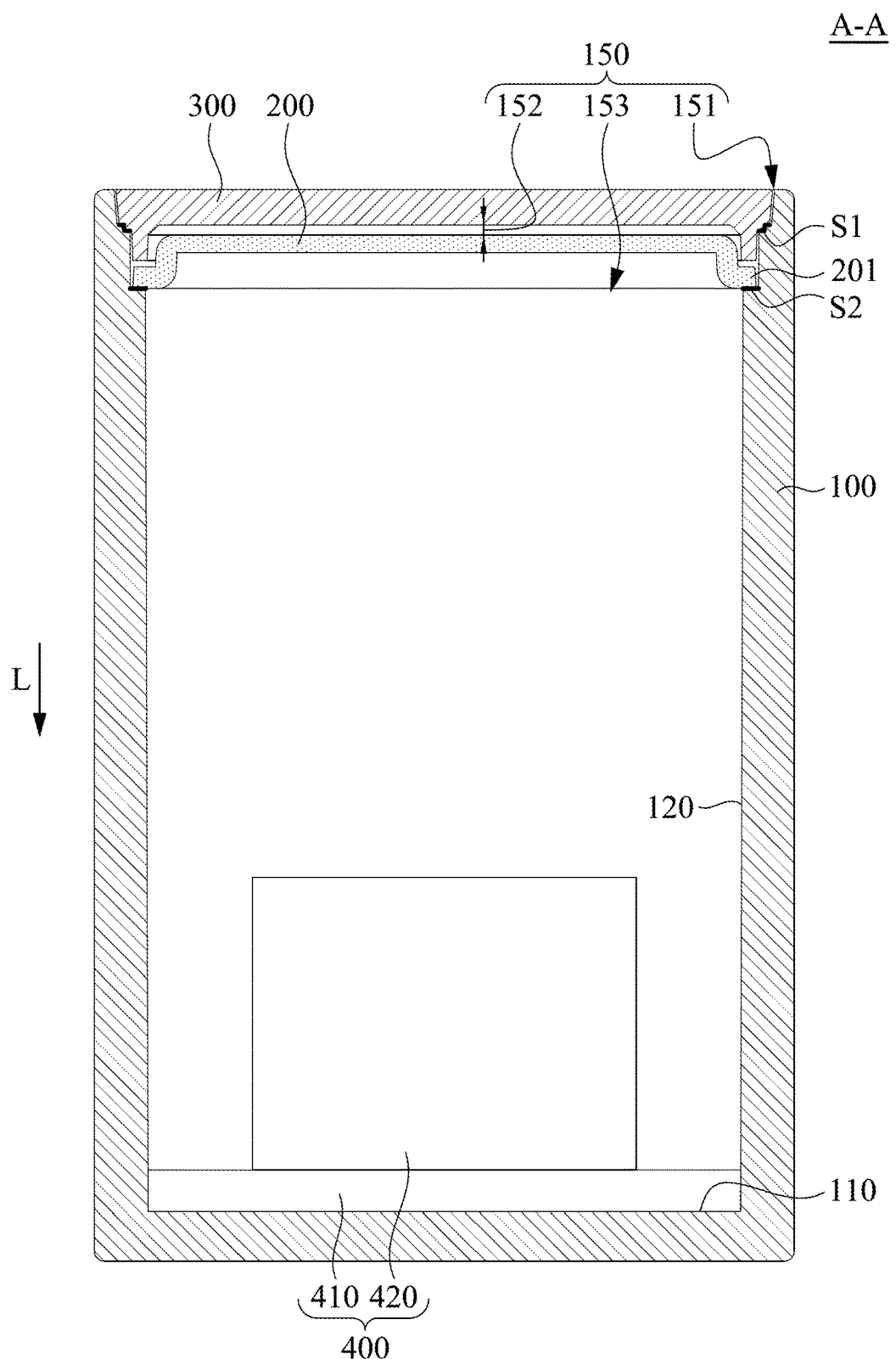
FIG. 2 is a cross-sectional view of the electrical device of FIG. 1 viewed along a line A-A.
Figure 3:
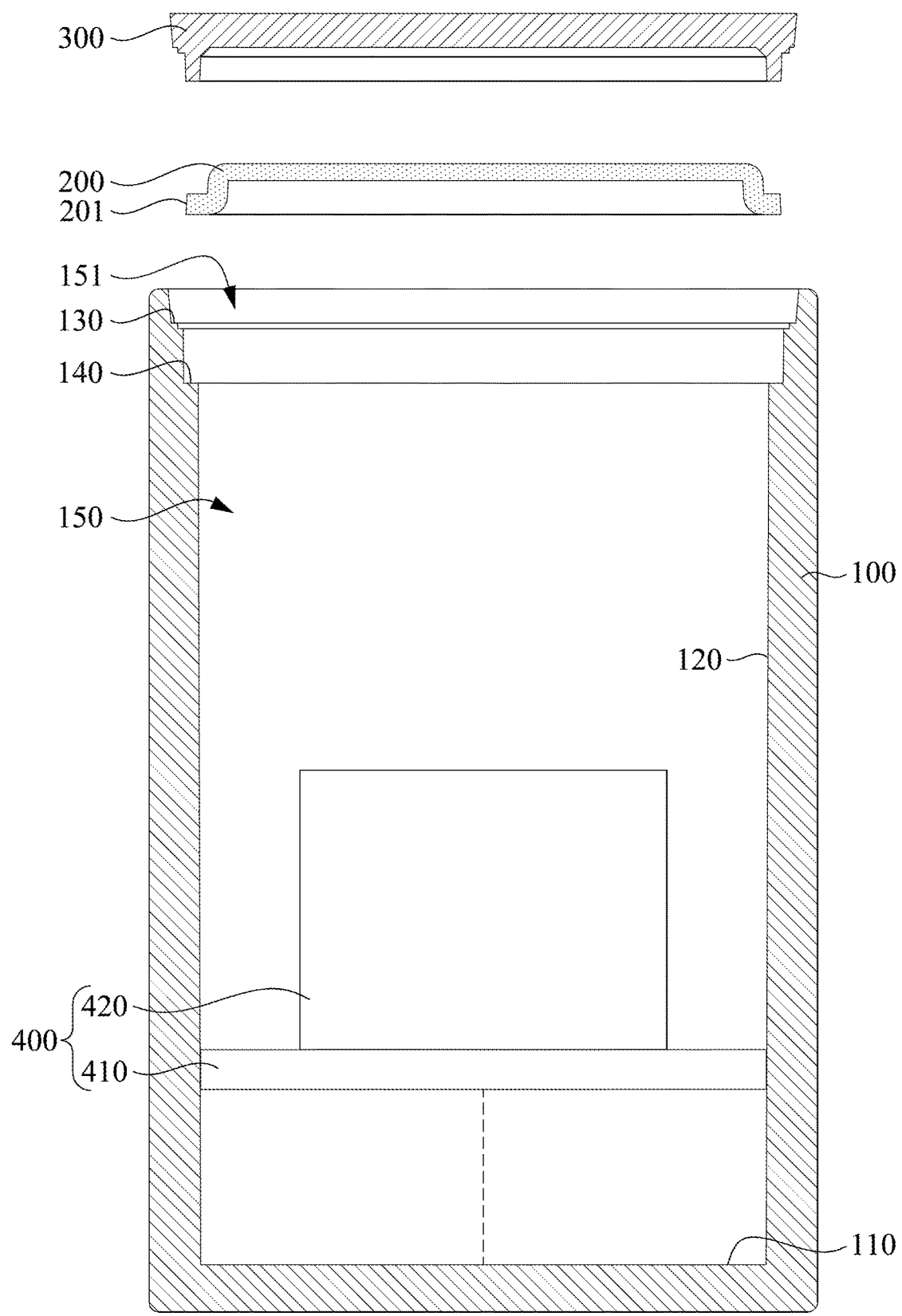
FIG. 3 is a disassembling view of the electrical device of FIG. 2.
Figure 4:
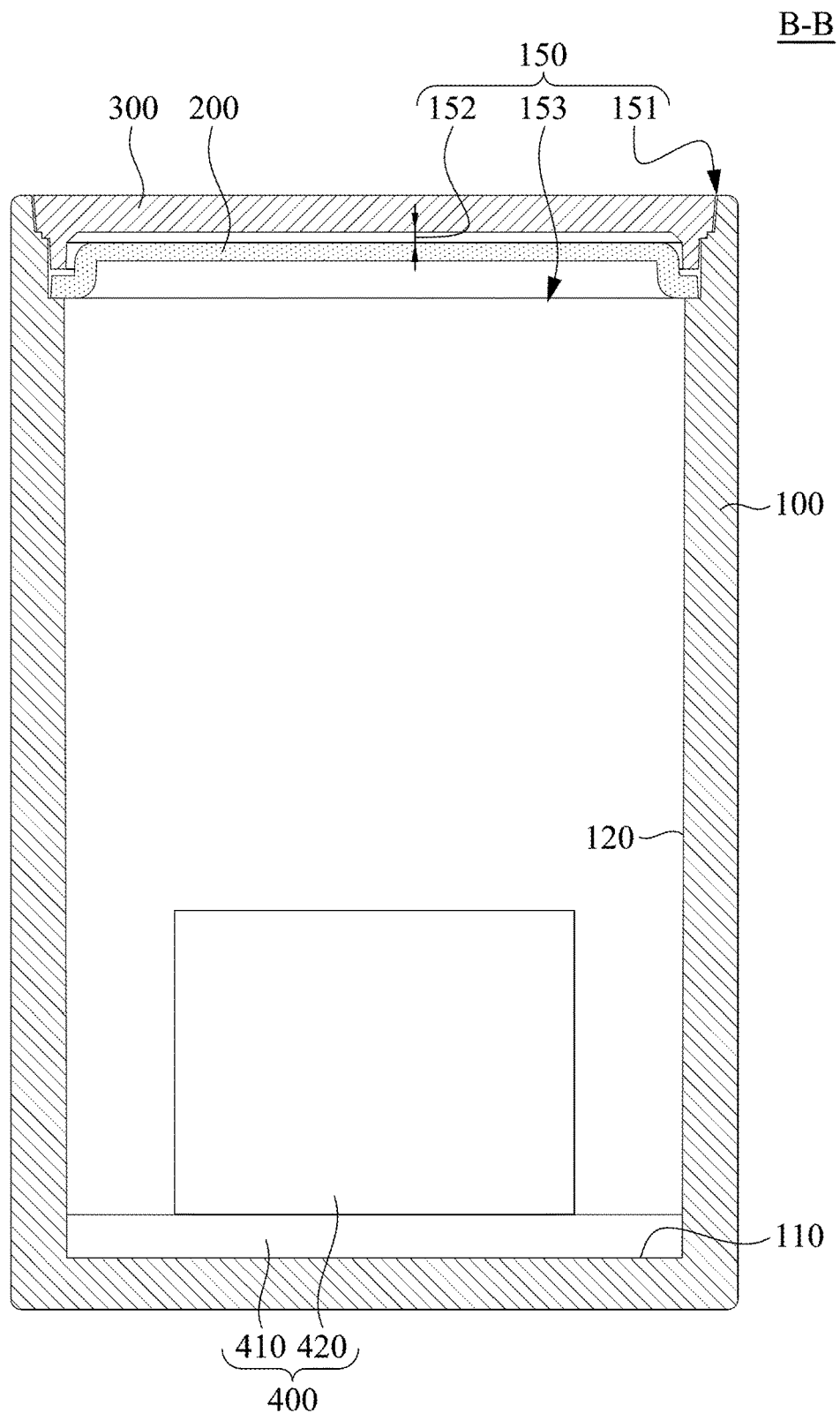
FIG. 4 is a cross-sectional view of the electrical device of FIG. 1 viewed along a line B-B.

Reference is now made to FIG. 1 to FIG. 4, in which FIG. 1 is a perspective view of an electrical device 10 according to one embodiment of the present disclosure, FIG. 2 is a cross-sectional view of the electrical device 10 of FIG. 1 viewed along a line A-A, FIG. 3 is a disassembling view of the electrical device 10 of FIG. 2, and FIG. 4 is a cross-sectional view of the electrical device 10 of FIG. 1 viewed along a line B-B. As shown in FIG. 1 to FIG. 2, the electrical device 10 includes a container 100, an inner cover 200, an outer cover 300, and a conversion unit 400. The container 100 includes an inner bottom surface 110 and a plurality of inner walls 120 surrounding and adjoining the inner bottom surface 110 collectively so that the inner bottom surface 110 and the inner walls 120 collectively define an accommodating channel 150. The accommodating channel 150 is provided with an inlet 151 that is opposite to the inner bottom surface 110. In the embodiment, the outer cover 300 covers the inlet 151 of the accommodating channel 150. The inner cover 200 is disposed within the accommodating channel 150, and located between the conversion unit 400 and the outer cover 300. A gap 152 (e.g., an air gap) is formed between the inner cover 200 and the outer cover 300, and a separation region 153 is formed between the inner cover 200 and the inner bottom surface 110, and the separation region 153 is used for accommodating with the conversion unit 400. The conversion unit 400 is functioned with a voltage transformation function, and the conversion unit 400 is, for example, an AC to DC converter, a recharger, or an adapter capable of connecting to the supply mains and outputting DC power to any electrical load. The conversion unit 400 may also be a DC to AC converter, such as an inverter, which converts the DC power into the AC power and feeds them to the supply mains. In addition, the conversion unit 400 may also be, for example, an AC to AC converter or a DC to DC converter, however, the present disclose is not limited thereto. The conversion unit 400 includes a circuit board 410 and a high-voltage-side voltage unit 420. The circuit board 410 is fixedly installed on the inner bottom surface 110, and the high-voltage-side voltage unit 420 is disposed on the circuit board 410, and completely disposed in the separation region 153 so that the high-voltage-side voltage unit 420 can be isolated from the externals.

The conversion unit 400 includes circuit components and windings on a primary side and a secondary side, respectively, and the above-mentioned high-voltage-side voltage unit 420 is indicated to the circuit components and windings of the conversion unit 400 on any side of the primary side and the secondary side that is opposite to the high voltage. Taking an adapter used to electrically charge a mobile phone for an example, a power source inputs mains AC with relatively high voltage to the circuit components and windings on the primary side, and inputs direct current with relatively low-voltage through the circuit components and windings on the secondary side. In this example, the above-mentioned high-voltage-side voltage unit 420 is the circuit components and windings of the adapter on the primary side. On the contrary, when taking an inverter applied to solar power generation for converting low-voltage direct current into high-voltage alternating current for another example, the circuit components and windings of the inverter on the primary side receive relatively low-voltage direct current, and outputs relatively high-voltage alternating current to the supply mains circuit through the windings and the circuit components on the secondary side. In this example, the high-voltage-side voltage unit 420 is the winding and the circuit components of the inverter on the secondary side. It is noted, the low-voltage-side voltage unit (not shown) being opposite to the high-voltage-side voltage unit 420 can be configured willingly according to the user's needs, which is not limited.

Outer edges 201 of the inner cover 200 are respectively connected to the inner walls 120, and the separation region 153 is closely covered by the inner cover 200. For example, the outer edges 201 of the inner cover 200 have flanges which surround the inner cover 200 and protrude outwardly, however, the present disclosure is not limited thereto. The inner cover 200 covers and shields the circuit board 410 and the high-voltage-side voltage unit 420. The coverage area of the inner cover 200 is approximately equal to the cross-sectional area of the separation region 153, so that the inner cover 200 completely shields the aforementioned conversion unit 400 in the separation region 153. In addition, it is noted, a side-wall opening (not shown) can also be provided on the inner bottom surface 110, so that a connecting wire can pass through the side-wall opening to be connected to the conversion unit 400. In this embodiment, neither the inner cover 200 nor the outer cover 300 is provided with any opening.

More specifically, as shown in FIG. 2 and FIG. 4, the container further includes a plurality of first flanges 130 and a plurality of second flanges 140. The first flanges 130 are presented as a stepped shape, formed on the inner wall 120 so as to collectively surround the inlet 151 of the accommodating channel 150. These first flanges 130 can support the outer cover 300 so that the outer cover 300 is positioned at the inlet 151 from being fallen into the accommodating channel 150. The second flanges 140 are presented as a stepped shape, arranged between the first flanges 130 and the inner bottom surface 110 to collectively surround the accommodating channel 150. These second flanges 140 can support the inner cover 200 so that the inner cover 200 is positioned at a specific location in the accommodating channel 150.

Furthermore, the inner cover 200 is fixed on the first flanges 130 through first bonding layers S1, and the outer cover 300 is fixed on the second flanges 140 through second bonding layers S2. For example, the inner cover 200 and the outer cover 300 are respectively coupled to the first flanges 130 and the second flanges 140 by ultrasonic welding, that is, the first connection layer S1 and the second connection layer S2 are ultrasonic welding portions, respectively.

However, the present disclosure is not limited to this. In other embodiments, the inner cover 200 may also be fixed on the first flanges 130 through one of adhesive layers and locking screws, and the inner cover 200 may also be fixed on the second flanges 140 through one of adhesive layers and locking screws to meet requirements and improve flexibility.

It is noted, in the embodiment, for example, the conversion unit 400 is fixedly disposed on the inner bottom surface 110 of the container 100. However, the present disclosure is not limited thereto. In other embodiments, the conversion unit 400 may also be disposed on the inner wall 120 of the container 100.

In addition, in this embodiment, for example, the container 100 is a rectangular body, however, the present disclosure is not limited to this, and in other embodiments, the container 100 may also be a cylindrical body having a single inner wall 120. In the embodiment, the inner cover 200 can be a plastic injection piece, and have advantages of high precision, low price, and high mass productivity. However, the present disclosure not limited to this.

However, in other embodiments of the present disclosure, the inner cover 200 and the outer cover 300 may have no gap therebetween.

In the embodiment, the above-mentioned electrical device 10 is not limited to mobile equipment, outdoor products, electronic products and the like.

Figure 5:
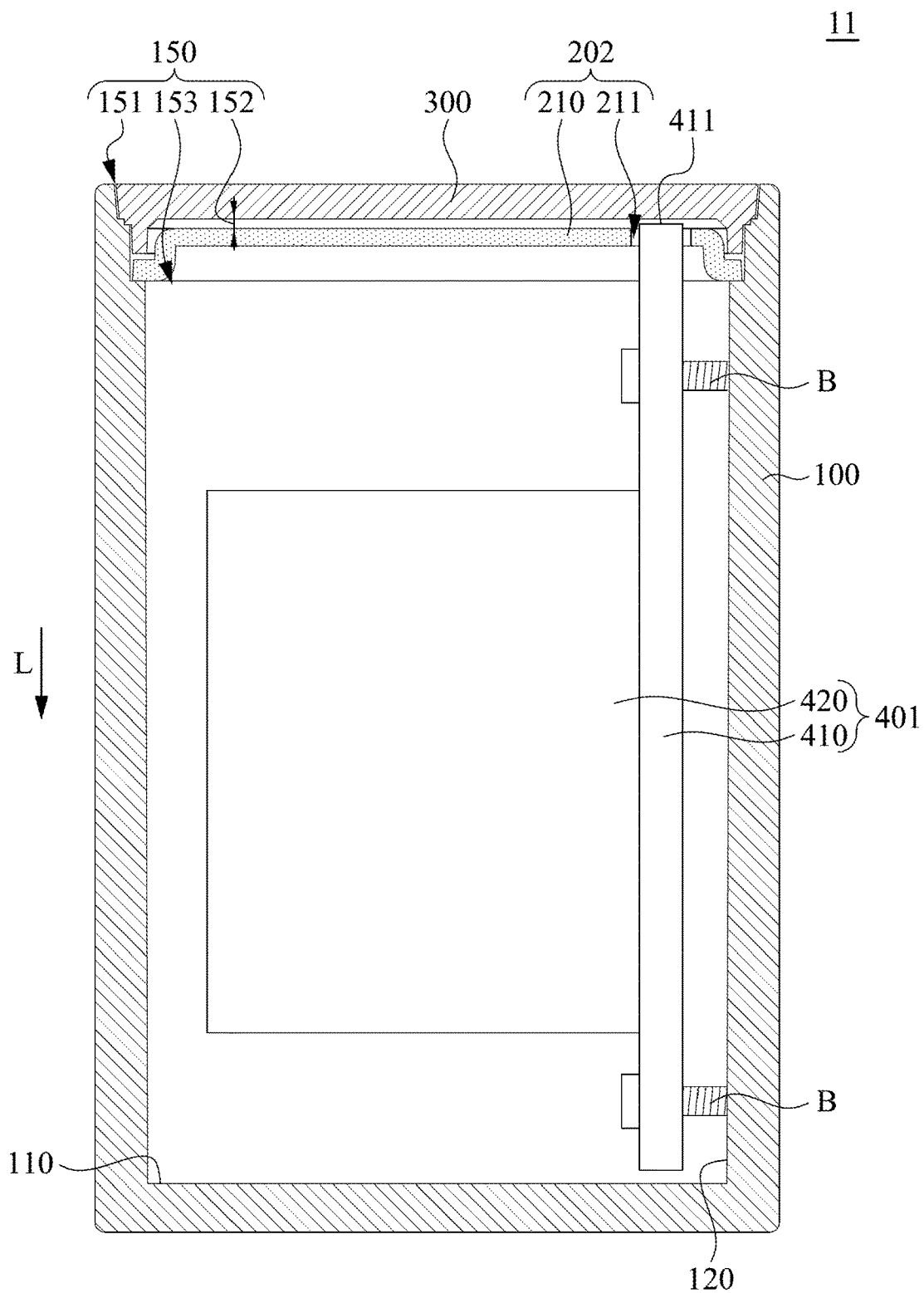
FIG. 5 is a cross-sectional view of an electrical device according to one embodiment of the present disclosure, and its cross-sectional position is the same as that in FIG. 2.
Figure 6:
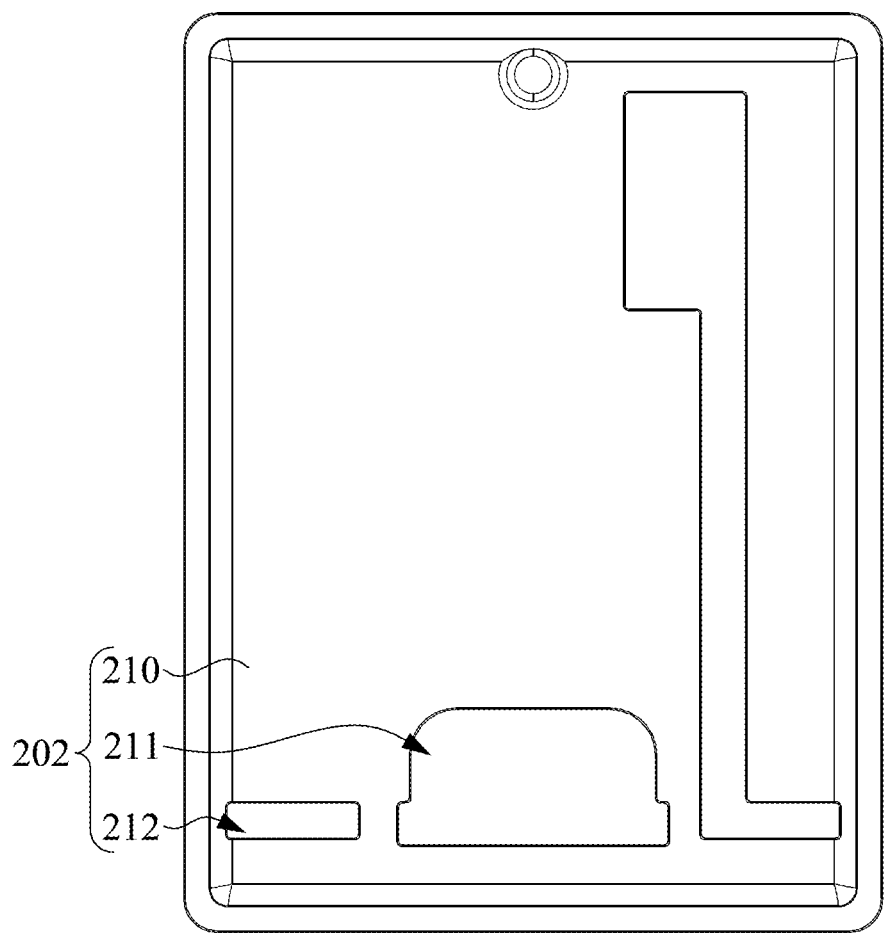
FIG. 6 is a top view of the inner cover in FIG. 5.

FIG. 5 is a cross-sectional view of an electrical device 11 according to one embodiment of the present disclosure, and its cross-sectional position is the same as that in FIG. 2, and FIG. 6 is a top view of the inner cover 200 in FIG. 5. As shown in FIG. 5 and FIG. 6, the electrical device 11 of the embodiment is substantially the same as the electrical device 10 of FIG. 1 except that comparing with the inner cover 202 in FIG. 2 having no opening, the inner cover 202 in FIG. 6 includes a cover body 210 and an opening 211. The cover body 210 covers the separation region 153, and the opening 211 penetrates through the cover body 210 to be in communication with the gap 152 and the separation region 153. The circuit board 410 of the conversion unit 401 is fixedly disposed on one of the inner walls 120, and the circuit board 410 is fixed to the inner wall 120 through bolts B, for example. The high-voltage-side voltage unit 420 is disposed on one surface of the circuit board 410 opposite to the inner wall 120. For example, one extending portion 411 of the circuit board 410 is able to extend into the gap 152 from the separation region 153 through the opening 211, so as to flexibly utilize the disposition space in the electrical device 11. However, the present disclosure is not limited thereto, for example, the circuit board 410 also may not extend into the gap 152.

Figure 7:
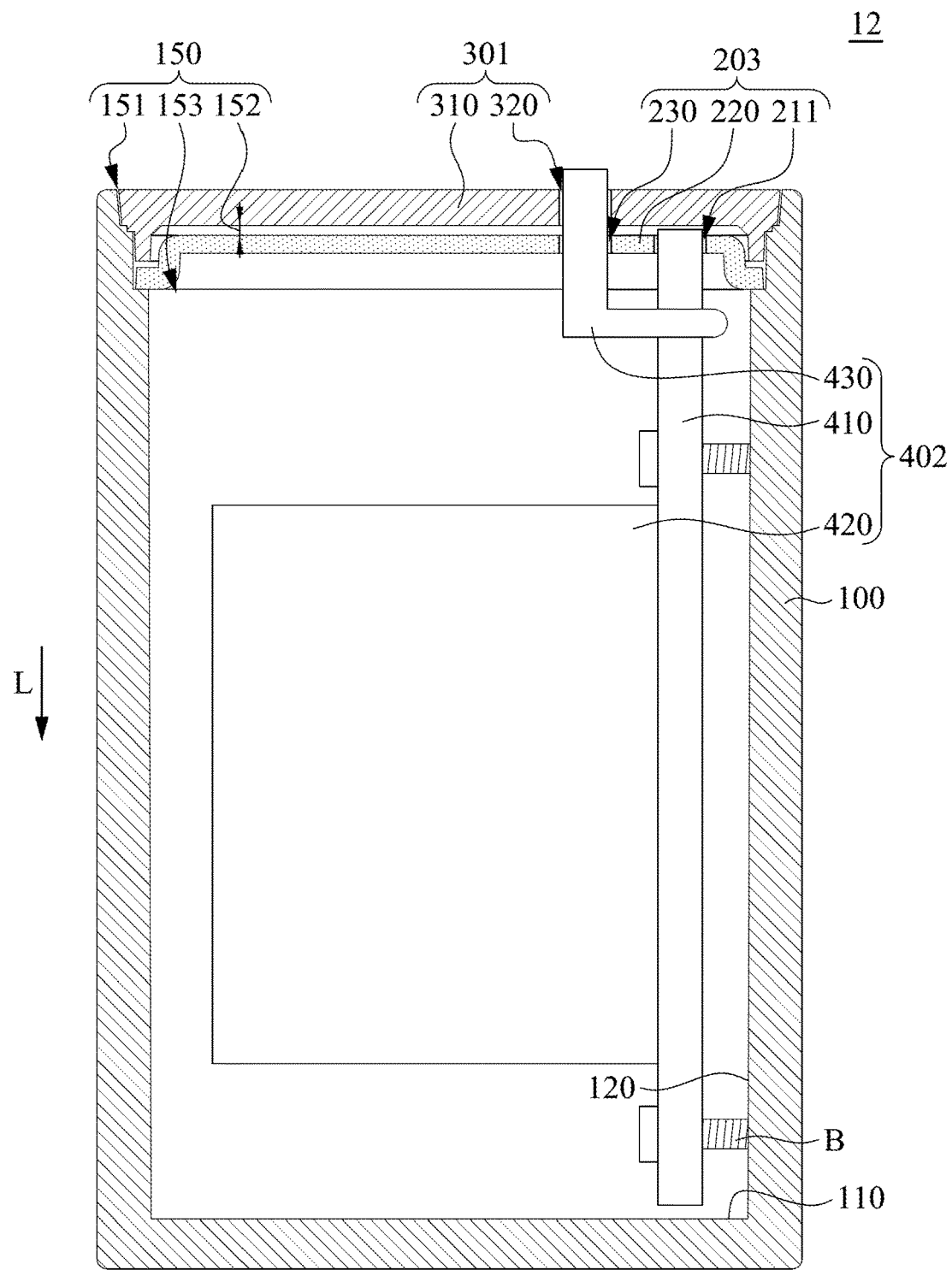
FIG. 7 is a cross-sectional view of an electrical device according to one embodiment of the present disclosure, and its cross-sectional position is the same as that in FIG. 4.

FIG. 7 is a cross-sectional view of an electrical device 12 according to one embodiment of the present disclosure, and its cross-sectional position is the same as that in FIG. 4. As shown in FIG. 7, the electrical device 12 of the embodiment is substantially the same as the electrical device 11 of FIG. 5 except that another portion in the conversion unit 402 that is not the high-voltage-side voltage unit 420 protrudes outwardly from the outer cover 301.

Specifically, the inner cover 203 includes a first cover body 220 and a first through hole 230 penetrating through the first cover body 220. The outer cover 301 includes a second cover body 310 and a second through hole 320. The second through hole 320 penetrates through the second cover body 310, corresponds to the first through hole 230, and is in communication with the separation region 153 of the accommodating channel 150 through the first through hole 230. The aforementioned conversion unit 402 further includes a connection unit 430. The circuit board 410 is fixed on the inner wall 120 and the inner cover 203, and a long axis direction L of the circuit board 410 is parallel to a long axis direction L of the accommodating channel 150. The connection unit 430 is disposed on the circuit board 410, and extends into the first through hole 230 and the second through hole 320 for connecting an external device (not shown in the figures) located outside the outer cover 301. For example, the connection unit 430 is a USB connection unit or an alternating current end wire or terminal (e.g., supply mains end). In other embodiments, the connection unit 430 also may not protrude outwards from the outer cover 301 and merely extend into the second through hole. However, the present disclosure is not limited to this. In other embodiments, the conversion unit 402 may only be fixed to the inner wall 120 or the first cover body 220. In other embodiments, the inner cover 203 also may be used for fixing the wiring (not shown in figures), increasing the stability of the wiring, thereby increasing the test strength of the connection unit 430 or the swing of the wiring.

Figure 8:
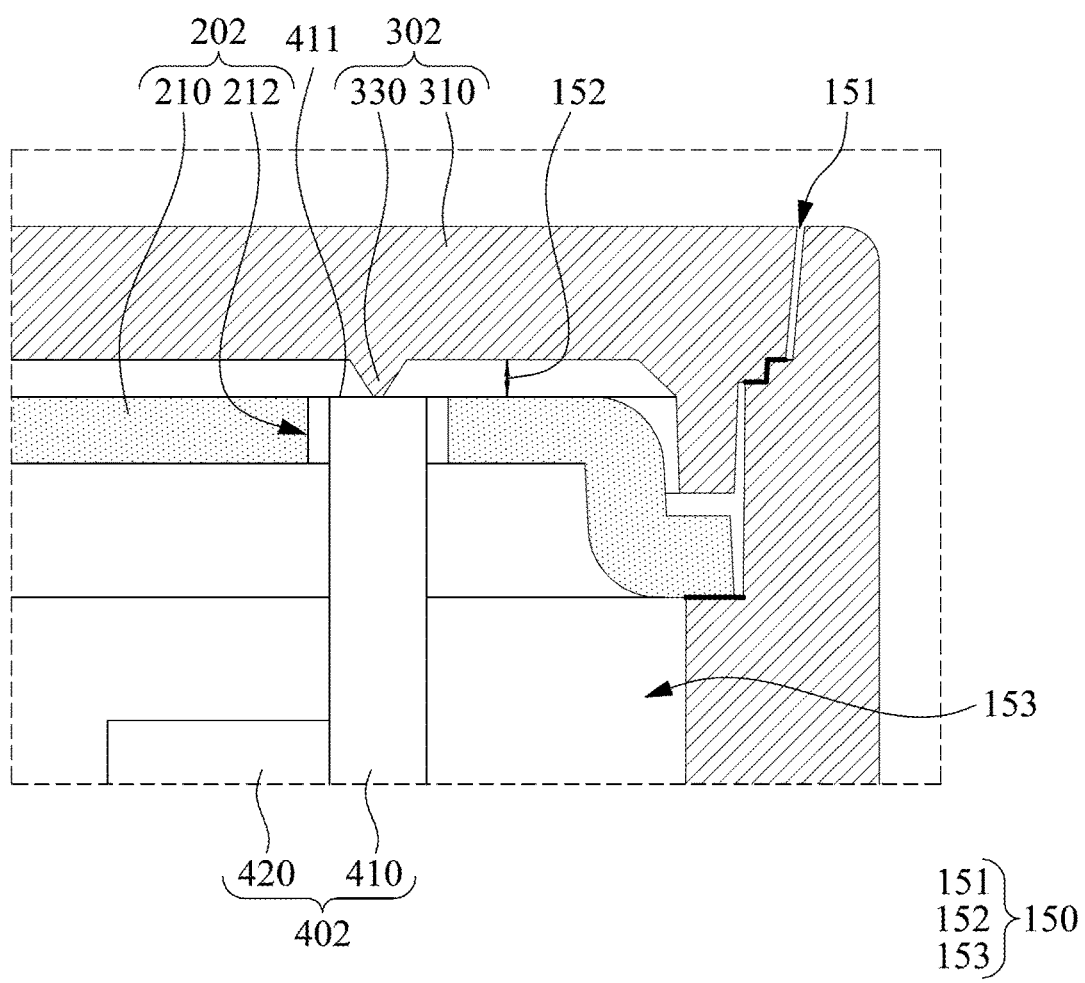
FIG. 8 is a partial cross-sectional view of an electrical device according to one embodiment of the present disclosure.

FIG. 8 is a partial cross-sectional view of an electrical device 13 according to one embodiment of the present disclosure. As shown in FIG. 6 and FIG. 8, the electrical device 13 of the embodiment is substantially the same as the electrical device 11 of FIG. 5 except that the inner cover 202 is further formed with another opening 212. The another opening 212 penetrates through the first cover body 210 to be in communication with the separation region 153. The outer cover 302 is further provided with at least one ultrasonic welding portion 330. The ultrasonic welding portion 330 is in a triangular shape, and is protruded from one surface of the second cover body 310 facing towards the first cover body 210, and the ultrasonic welding portion 330 correspondingly extends into the above-mentioned opening 212.

After the conversion unit 402, the inner cover 202 and the outer cover 302 are assembled to the container 100, another extending portion 411 of the circuit board 410 of the conversion unit 402 extends into the opening 212 but does not extend into the gap 152. Then, through the implementation of the ultrasonic welding technology, the extending portion 411 of the circuit board 410 can be soldered with the ultrasonic welding portion 330 to be fixed to the outer cover 302 to strengthen the fixing performance of the circuit board 410. In other embodiments, the ultrasonic welding portion 330 can also extend into the opening 212 to be fixedly connected with the circuit board 410 through ultrasonic welding; or the ultrasonic welding portion 330 can also pass through the opening 132 to be fixedly connected with the circuit board 410 through ultrasonic welding; alternatively, the ultrasonic welding portion 330 extends into the separation region 153 via the opening 212, and is fixedly connected with the circuit board 410 by ultrasonic welding, however, the present disclosure is not limited thereto.

Figure 9:
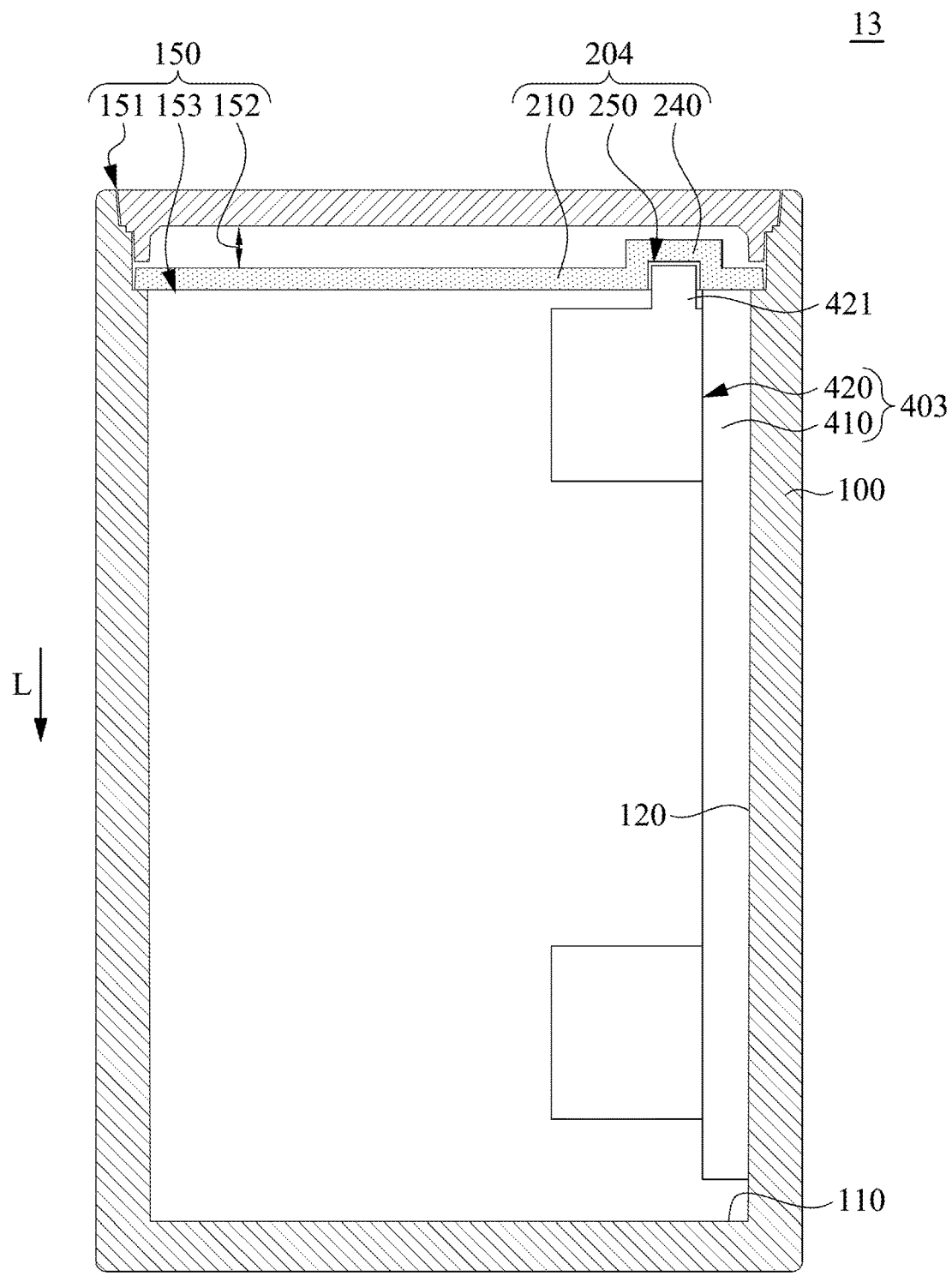
FIG. 9 is a cross-sectional view of an electrical device according to one embodiment of the present disclosure, and its cross-sectional position is the same as that in FIG. 4.

FIG. 9 is a cross-sectional view of an electrical device 13 according to one embodiment of the present disclosure, and its cross-sectional position is the same as that in FIG. 4. As shown in FIG. 9, the electrical device 13 of the embodiment is substantially the same as the electrical device 10 of FIG. 2 except that the inner cover 204 further includes a cover body 210, a convex portion 240 and a groove 250. The convex portion 240 extends into the gap 152 from one surface of the cover body 210. The groove 250 corresponds to the convex portion 240. The groove 250 is recessed in a direction from the other surface of the cover body 210 towards the convex portion 240, and one part of the conversion unit 403 is located within the groove 250. In the embodiment, the cover body 210, the convex portion 240 and the groove 250 are integrated together, however, the disclosure is not limited thereto.

More specifically, for example, one portion 421 of the high-voltage-side voltage unit 420 can protrude into the groove 250 from the separation region 153, so as to flexibly utilize the disposition space in the electrical device 13. However, the present disclosure is not limited thereto, for example, the portion of the high-voltage-side voltage unit also may not extend into the groove.

Figure 10:
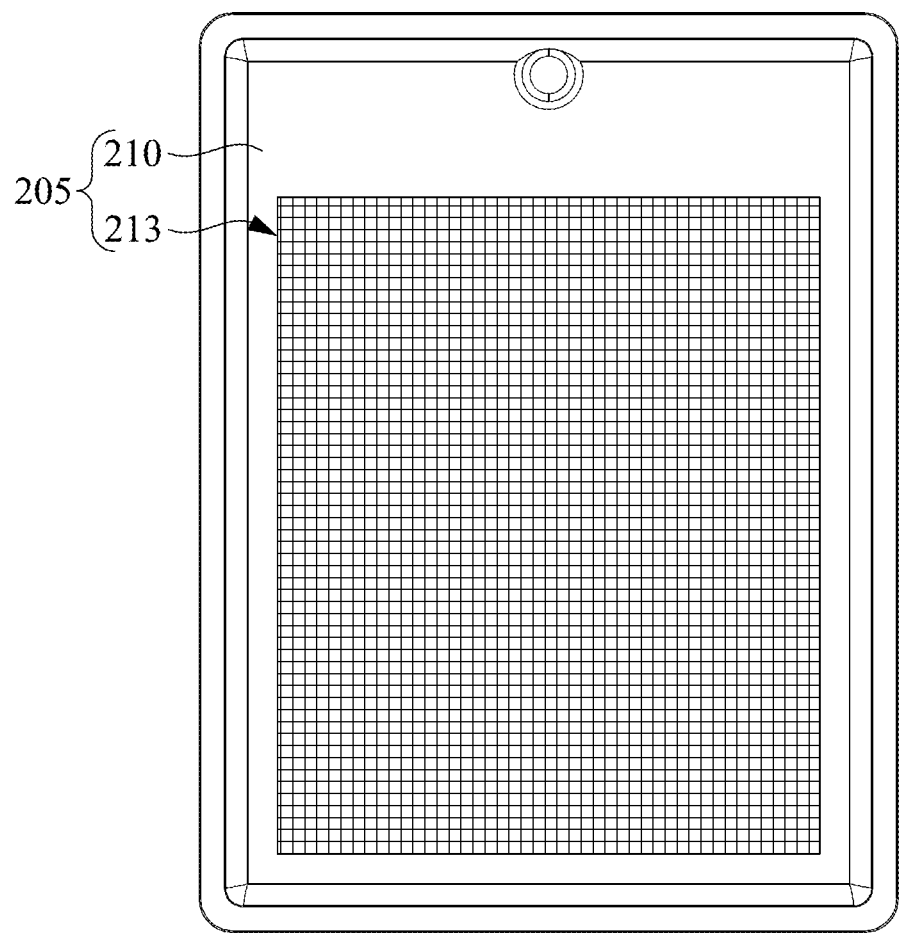
FIG. 10 is a top view of the inner cover according to one embodiment of the present disclosure

FIG. 10 is a top view of the inner cover 205 according to one embodiment of the present disclosure. The electrical device 13 of the embodiment is substantially the same as the electrical device 10 of FIG. 2 except that comparing with the inner cover 200 being solid totally, in the embodiment, as shown in FIG. 2 and FIG. 10, the part of the inner cover 205 used to shade the conversion unit 400 above can be meshed, and can separate the conversion unit 400 and the outer cover 300 (refer to FIG. 2) by an isolation mesh structure.

More specifically, as shown in FIG. 10, the inner cover 205 further includes a mesh area 213 formed on the cover body 210, and overlapped with the high-voltage-side voltage unit 420 below so as to allow airflow to be circulated between the separation region 153 and the gap 152 (refer to FIG. 2). In this way, a user is able to view the conversion unit 400 in the separation region 153 through the mesh area 213, and not needed to remove the inner cover 205 away from the container 100 so as to have separation effect at the same.

Figure 11:
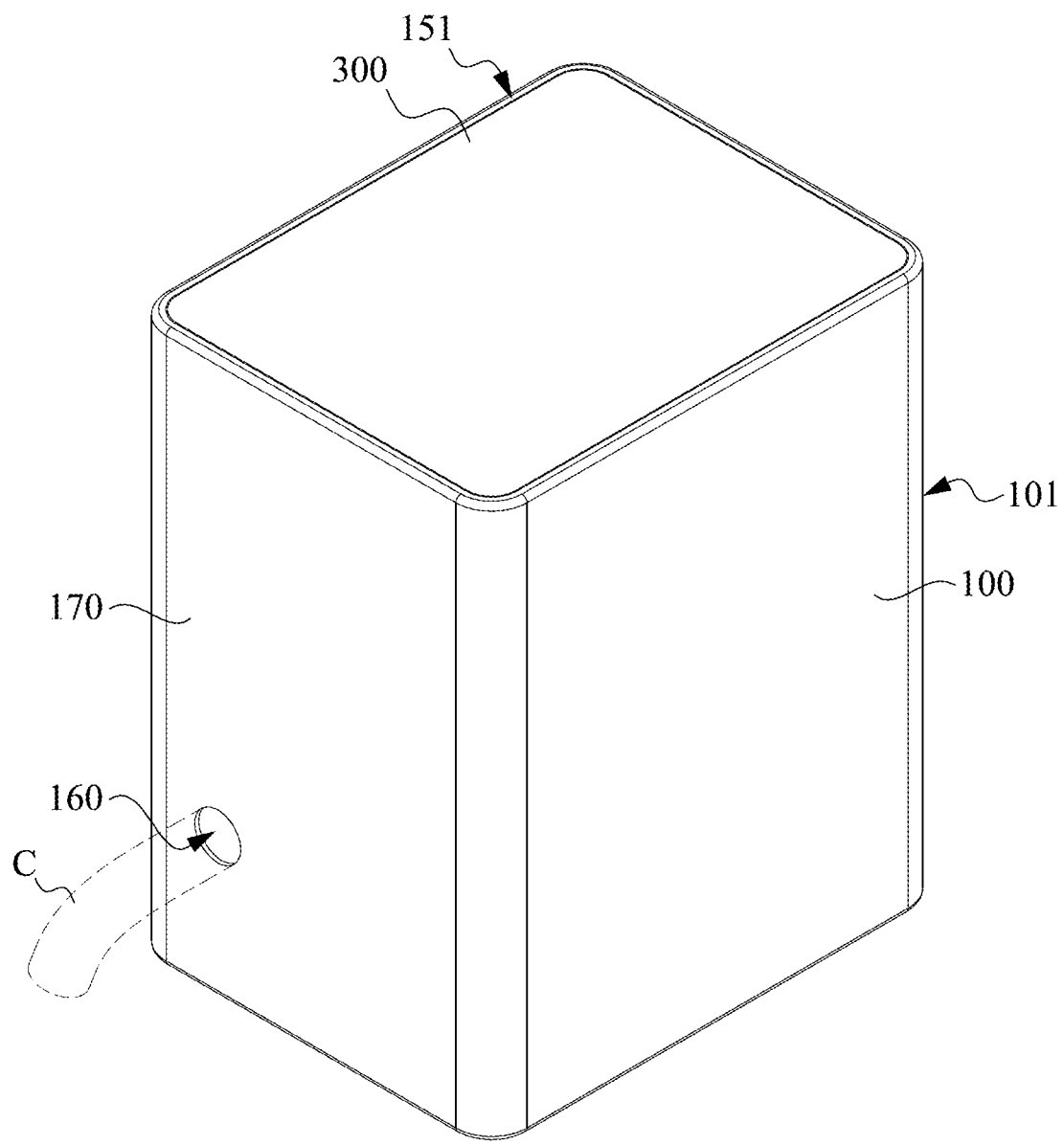
FIG. 11 is a perspective view of an electrical device according to one embodiment of the present disclosure.

FIG. 11 is a perspective view of an electrical device 14 according to one embodiment of the present disclosure. As shown in FIG. 11, the electrical device 14 of the embodiment is substantially the same as the electrical device 10 of FIG. 2, except that comparing with the electrical device 10 in FIG. 2, the container 101 of the embodiment includes at least one sidewall opening 160 that is formed on an outer side wall 170 of the container 101 and in communication with the accommodating channel 150 so that a wire C of the electrical device 14 can be connected to the conversion unit 400 (refer to FIG. 2) through the sidewall opening 160.

To sum up, since the inner cover in each of the embodiments above may or may not have a breach (e.g., an opening or a perforation), for example, the ratio of the coverage area of the inner cover to the cross-sectional area of the accommodating channel is 99% to 100%; or 70% to 95%, thus, not only the weight of the inner cover can be adjusted, but also the size of the airflow in the accommodating channel can be adjusted. In addition, in the above embodiments, the outer cover and the inner cover are presented independently with each other and not physically linked to each other.

Thus, through the construction of the embodiments above, not only the structural strength of the electrical device can be improved, but also the safety concerns caused by the external exposure of the internal electrical components can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An electrical device, comprising:
   a container having an inner bottom surface and at least one inner wall, wherein the inner bottom surface and the at least one inner wall collectively define an accommodating channel, and an inlet of the accommodating channel is opposite to the inner bottom surface;
   a conversion unit disposed within the accommodating channel;
   an outer cover covering the inlet of the accommodating channel; and
   an inner cover disposed within the accommodating channel, and located between the conversion unit and the outer cover, and a gap that is formed between the outer cover and the inner cover, and the inner cover comprising a cover body and an opening formed on the cover body and being in communication with the gap and the accommodating channel,
   wherein one surface of the outer cover facing towards the inner cover is recessed with a sunken portion, the gap is arranged within the sunken portion, and one part of the conversion unit extends into the gap through the opening, and at least one outer edge of the cover body is connected to the at least one inner wall of the container.

2. The electrical device of claim 1, wherein the container comprising:
   at least one first flange disposed on the at least one inner wall of the container for supporting the outer cover; and
   at least one second flange disposed on the at least one inner wall of the container, and arranged between the at least one first flange and the inner bottom surface for supporting the inner cover.

3. The electrical device of claim 2, wherein the inner cover is fixed on the at least one first flange through a first bonding layer, and the outer cover is fixed on the at least one second flange through a second bonding layer.

4. The electrical device of claim 1, further comprising a connection unit, wherein the inner cover is formed with a first through hole, the outer cover is formed with a second through hole, and the second through hole is corresponded to the first through hole and in communication with the accommodating channel through the first through hole, and the connection unit passes through the first through hole and the second through hole.

5. The electrical device of claim 1, wherein one part of the outer cover is connected to the one part of the conversion unit which extends into the opening.

6. The electrical device of claim 1, wherein the conversion unit comprises a circuit board fixed to the cover body and the at least one inner wall, wherein one part of the circuit board is the one part of the conversion unit.

7. The electrical device of claim 1, wherein the inner cover comprises a mesh area formed on the cover body.

8. The electrical device of claim 1, wherein a ratio of a coverage area of the inner cover to a cross-sectional area of the accommodating channel is in a range of 70% to 95%.

9. An electrical device, comprising:
   a container having an inner bottom surface and at least one inner wall, wherein the inner bottom surface and the at least one inner wall collectively define an accommodating channel, and an inlet of the accommodating channel is opposite to the inner bottom surface;
   a conversion unit having a high-voltage-side voltage unit that is disposed within the accommodating channel;
   an outer cover covering the inlet of the accommodating channel; and
   an inner cover disposed within the accommodating channel, and located between the conversion unit and the outer cover, and a gap that is formed between the outer cover and the inner cover, and the inner cover comprising a cover body covering the high-voltage-side voltage unit, and an opening formed on the cover body and being in communication with the gap and the accommodating channel,
   wherein one surface of the outer cover facing towards the inner cover is recessed with a sunken portion, the gap is arranged within the sunken portion, one part of the conversion unit extends into the gap through the opening, and at least one outer edge of the cover body is connected to the at least one inner wall.

10. The electrical device of claim 9, wherein the container comprising:
    at least one first flange disposed on the at least one inner wall of the container for supporting the outer cover; and
    at least one second flange disposed on the at least one inner wall of the container, and arranged between the at least one first flange and the inner bottom surface for supporting the inner cover.

11. The electrical device of claim 9, wherein the inner cover further comprises a convex portion and a groove, the convex portion extends into the sunken portion from one surface of the cover body, the groove corresponds to the convex portion, and the groove is recessed in a direction from the other surface of the cover body towards the convex portion, wherein one part of the conversion unit is located within the groove.

12. The electrical device of claim 9, further comprising a connection unit, wherein the inner cover is formed with a first through hole, the outer cover is formed with a second through hole, and the second through hole is corresponded to the first through hole and in communication with the accommodating channel through the first through hole, and the connection unit passes through the first through hole and the second through hole.

13. The electrical device of claim 9, wherein a ratio of a coverage area of the inner cover to a cross-sectional area of the accommodating channel is in a range of 70% to 95%.

14. The electrical device of claim 9, wherein the inner cover comprises a mesh area formed on the cover body, and overlapped with the high-voltage-side voltage unit.

15. An electrical device, comprising:
    a container having an inner bottom surface and at least one inner wall, wherein the inner bottom surface and the at least one inner wall collectively define an accommodating channel, and an inlet of the accommodating channel is opposite to the inner bottom surface, and a side wall opening that is formed on one of the inner bottom surface and the at least one inner wall;

a conversion unit disposed within the accommodating channel;

an outer cover covering the inlet of the accommodating channel; and an inner cover disposed within the accommodating channel, and located between the conversion unit and the outer cover, and a gap that is formed between the outer cover and the inner cover, and the inner cover comprising a cover body totally covering the conversion unit, wherein one surface of the outer cover facing towards the inner cover is recessed with a sunken portion, and the gap is arranged within the sunken portion, and at least one outer edge of the cover body is connected to the at least one inner wall.

16. The electrical device of claim 15, wherein the container comprising:

at least one first flange disposed on the at least one inner wall of the container for supporting the outer cover; and at least one second flange disposed on the at least one inner wall of the container, and arranged between the at least one first flange and the inner bottom surface for supporting the inner cover.

17. The electrical device of claim 16, wherein the inner cover is fixed on the at least one first flange through a first bonding layer, and the outer cover is fixed on the at least one second flange through a second bonding layer.

18. The electrical device of claim 15, wherein the inner cover further comprises a convex portion and a groove, the convex portion extends into the sunken portion from one surface of the cover body, the groove corresponds to the convex portion, and the groove is recessed in a direction from the other surface of the cover body towards the convex portion, wherein one part of the conversion unit is located within the groove.

19. The electrical device of claim 15, wherein the cover body comprises a mesh area overlapped with the conversion unit.

* * * * *